United States Patent
Hoster et al.

(10) Patent No.: US 7,632,689 B2
(45) Date of Patent: Dec. 15, 2009

(54) METHODS FOR CONTROLLING THE PROFILE OF A TRENCH OF A SEMICONDUCTOR STRUCTURE

(75) Inventors: Benjamin C. Hoster, Pflugerville, TX (US); William S. Bass, Bastrop, TX (US)

(73) Assignee: Spansion LLC, Sunnyvale, CA (US)

( * ) Notice: Subject to any disclaimer, the term of this patent is extended or adjusted under 35 U.S.C. 154(b) by 180 days.

(21) Appl. No.: 11/538,403

(22) Filed: Oct. 3, 2006

(65) Prior Publication Data
US 2008/0090408 A1   Apr. 17, 2008

(51) Int. Cl.
*H01L 21/467* (2006.01)
(52) U.S. Cl. .................... 438/8; 438/640; 438/701; 438/736; 438/978; 257/E21.579
(58) Field of Classification Search .................. 438/640
See application file for complete search history.

(56) References Cited

U.S. PATENT DOCUMENTS

| | | | |
|---|---|---|---|
| 6,946,391 B2* | 9/2005 | Tsai et al. .................... | 438/638 |
| 7,022,602 B2* | 4/2006 | Ruelke et al. ............... | 438/640 |
| 7,235,414 B1* | 6/2007 | Subramanian et al. ........ | 438/16 |
| 2001/0027002 A1* | 10/2001 | Matsumoto .................. | 438/584 |

* cited by examiner

*Primary Examiner*—Stephen W Smoot

(57) ABSTRACT

Methods for controlling the profile of a trench of a semiconductor structure comprise the step of depositing a photoresist within a via and overlying a second dielectric layer. An image layer is deposited overlying the photoresist and is patterned to form a first trench having a first width and a second width that are not equal and a first angle. The photoresist is dry etched using dry etch parameters, at least one of which is selected based on the first angle and the first and the second widths of the first trench to form a second trench in the photoresist. The second dielectric layer is etched to form a third trench.

20 Claims, 7 Drawing Sheets

METHODS FOR CONTROLLING THE PROFILE OF A TRENCH OF A SEMICONDUCTOR STRUCTURE

FIELD OF THE INVENTION

The present invention generally relates to semiconductor structures, and more particularly relates to methods for controlling the profile of a trench etched into a dielectric layer of a semiconductor structure.

BACKGROUND OF THE INVENTION

Conventional semiconductor devices typically comprise a semiconductor substrate and a plurality of dielectric and conductive layers formed thereon. An integrated circuit contains numerous microelectronic devices, such as metal oxide semiconductor field effect transistors (MOSFETs), a plurality of conductive patterns comprising conductive lines separated by interwiring spacings, and a plurality of interconnect lines, such as bus lines, bit lines, word lines, and logic interconnect lines. Such interconnection lines, made of metal interconnect materials, generally constitute a limiting factor in terms of size (width) and various functional characteristics of the integrated circuit. As such, there exists a need to efficiently provide a reliable interconnection structure having a small size yet capable of achieving higher operating speeds, improved signal-to-noise ratio, and improved reliability.

Using a dual damascene process, semiconductor devices are patterned with several thousand openings for conductive lines and vias which are filled with a conductive metal, such as aluminum or copper, and serve to interconnect the active and/or passive elements of the integrated circuit. The dual damascene process also is used for forming the multilevel signal lines of conductive metal in the insulating layers of a multilayer substrate on which semiconductor devices are mounted.

Damascene (single damascene) is an interconnection fabrication process in which trenches are formed in an insulating structure and filled with metal to form the conductive lines. Dual damascene is a multi-level interconnection process in which, in addition to forming the trenches of single damascene, the conductive via openings also are formed.

In one type of dual damascene processes, a first mask with the image pattern of the via openings is formed over the insulating structure and the wafer is anisotropically etched in the upper portion of the insulating structure (via etch). After removal of the patterned resist material, a second mask is formed over the insulating structure with the image pattern of the conductive lines in alignment with the via openings. In anisotropically etching the openings for the conductive lines in the upper half of the insulating material (trench etch), the via openings already present in the upper half are simultaneously etched in the lower half of the insulating material. After the etching is complete, both the vias and trenches are filled with metal.

In another type of dual damascene processes, a first mask is formed over the insulating structure with the image pattern of the via openings and the pattern is anisotropically etched in the insulating structure (via etch). After removal of the patterned resist material, a second mask is formed over the insulating structure with the image pattern of the conductive lines in alignment with the via openings and the pattern of the conductive lines is anisotropically etched (trench etch). After the etching is complete, both the vias and trenches are filled with metal.

Dual damascene is an improvement over single damascene because it permits the filling of both the conductive trenches and vias with metal at the same time, thereby eliminating process steps. However, deviations from desired dimensions of the trenches may result from variations in the photolithography and etching processes. Such deviations make it difficult to produce semiconductor structures with consistent physical and/or electrical characteristics.

Accordingly, it is desirable to provide a method for controlling the profile of a trench etched into a semiconductor structure. In addition, it is desirable to provide a method for forming a trench during a dual damascene process of a semiconductor structure that provides for consistent feature dimensions. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

In accordance with an exemplary embodiment of the present invention, a method for controlling the profile of a trench of a semiconductor structure having a first dielectric layer, a first etch stop layer disposed on the first dielectric layer, a second dielectric layer disposed on the first etch stop layer, and a via formed at least through the second dielectric layer is provided. The method comprises the step of depositing a photoresist within the via and overlying the second dielectric layer. An image layer is deposited overlying the photoresist and is patterned to form a first trench within the image layer overlying the via. The first trench is defined at least partly by a first wall of the image layer disposed at a first angle, greater than about 90°, from a surface of the photoresist and a second wall of the image layer. The first trench has a first width proximate to the photoresist and a second width remote from the photoresist. The first width and the second width of the first trench are not equal. The photoresist is dry etched using dry etch parameters, at least one of which is selected based on the first angle, and the first and the second widths of the first trench to form a second trench in the photoresist and to remove the photoresist from the via. The second dielectric layer is etched to form a third trench in the second dielectric layer.

In accordance with another exemplary embodiment of the invention, a method for forming a trench during dual damascene processing of a semiconductor structure is provided. The semiconductor structure has a first silicon oxide layer, a first etch stop layer disposed overlying the first silicon oxide layer, a second silicon oxide layer overlying the first etch stop layer, and a via formed within the first silicon oxide layer, the first etch stop layer, and the second silicon oxide layer. The method comprises the step of depositing a photoresist within the via and overlying the second silicon oxide layer. A patterned mask is formed overlying the photoresist with an opening disposed overlying the via. The opening has a first width and a larger second width and a wall of the mask defining the opening is at a first angle, greater than about 90°, from a surface of the photoresist. The photoresist is etched to substantially remove the photoresist from the via and to form a first trench in the photoresist overlying the via. Etching of the photoresist is performed using at least one etch process parameter that is selected based on the first width and second width of the opening and the first angle. The first trench has a first width and a second width and a wall of photoresist defining the first trench is at a second angle with a surface of the second silicon oxide layer. The second silicon oxide layer is etched to form a second trench therein. The second trench has a first width and a second width and a wall of the second silicon oxide layer defining the second trench is at a third angle with the first etch stop layer. The first width and second width of the second trench and the third angle are formed based on the first width and the second width of the first trench and on the second angle.

In accordance with a further exemplary embodiment of the invention, a method for performing a dual damascene process on a semiconductor structure having a first etch stop layer, a first dielectric layer overlying the first etch stop layer, a second etch stop layer overlying the first dielectric layer, and a second dielectric layer overlying the second etch stop layer is provided. The method comprises the steps of etching a via through at least the second dielectric layer and depositing a photoresist within the via and overlying the second dielectric layer. An image layer is deposited overlying the photoresist layer and is patterned to form a first trench in the image layer. The first trench has a first width and a second width that is not equal to the first width. A surface of the photoresist and a wall of the image layer defining the first trench form a first angle that is greater than about 90°. At least one process parameter of a process to etch the photoresist is selected. The at least one process parameter is selected based on the first angle and the first and second widths of the first trench. The photoresist is etched using the at least one process parameter to form a second trench in the photoresist. A third trench is etched in the second dielectric layer and a conductive material is deposited within the via and the third trench.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
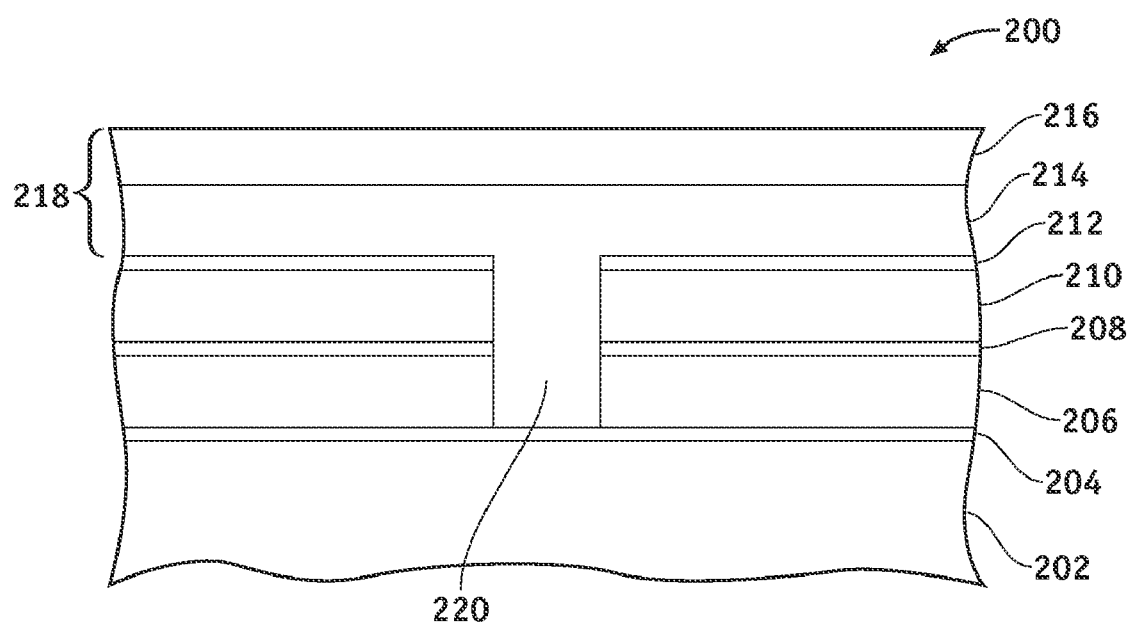
FIGS. 1-5 illustrate a method for controlling the profile of a trench etched into a semiconductor structure in accordance with an exemplary embodiment of the present invention.

FIGS. 1-5 and 6 illustrate a method 100 for controlling the profile of a trench etched into a semiconductor structure 200 in accordance with an exemplary embodiment of the present invention. Referring to FIG. 1, the method 100 begins with a semiconductor structure 200 having a substrate 202, a first etch stop layer 204 disposed overlying the substrate, a first dielectric layer 206 disposed overlying the first etch stop layer 204, a second etch stop 208 overlying the first dielectric layer 206, and a second dielectric layer 210 overlying the second etch stop layer 208. An optional third etch stop layer 212 is disposed overlying second dielectric layer 210.

Suitable substrates 202 upon which the first etch stop layer 204 is disposed include silicon wafers, either in their original state or upon which various metal, dielectric or other material layers have been deposited. The substrate may be functionalized glass, silicon, germanium, gallium arsenide, gallium phosphorous, silicon dioxide, silicon nitride, modified silicon or any one of a wide variety of gels or polymers, such as (poly)tetrafluoroethylene, (poly)vinylidenedifluoride, polystyrene, polycarbonate, polypropylene, or combinations thereof.

First dielectric layer 206 and second dielectric layer 210 may be comprised of dielectric or insulating material such as silicon-based dielectric materials, silicates, and low dielectric materials. Silicon-based dielectric materials include silicon dioxide, silicon nitride, and silicon oxynitride. Silicates include fluorine-doped silicon glass (FSG), tetraethylorthosilicate (TEOS), borophosphotetraethylorthosilicate (BP-TEOS), phosphosilicate glass (PSG), borophosphosilicate glass (BPSG), and any other suitable spin-on glass. Low dielectric polymer materials include one or more of polyimides, fluorinated polyimides, polysilsequioxane, benzocyclobutene (BCB), poly(arylene ester), parylene F, parylene N, amorphous polytetrafluoroethylene, and the like.

First etch stop layer 204 may comprise any suitable, known etch stop material where there is etch selectivity between first dielectric layer 206 and first etch stop layer 204. Likewise, second etch stop layer 208 may comprise any suitable, known etch stop material where there is etch selectivity between second dielectric layer 210 and second etch stop layer 208. For example, first and second dielectric layers 206 and 210 may comprise TEOS while first and second etch stop layers 204 and 208 comprise silicon nitride, silicon oxynitride, silicon carbide, or the like. Third etch stop layer 212 may comprise silicon nitride, silicon oxynitride, or any other material where there is etch selectivity between third etch stop layer 212 and a photoresist layer 214, discussed in more detail below. Third etch stop layer 212 also may comprise or serve as an anti-reflective coating. In another exemplary embodiment of the invention, there is etch selectivity between second dielectric layer 210 and a photoresist layer 214. Accordingly, semiconductor structure 200 does not comprise third etch stop layer 212. For purposes of explanation, semiconductor structure 200 will be illustrated with third etch stop layer 212.

Figure 6:
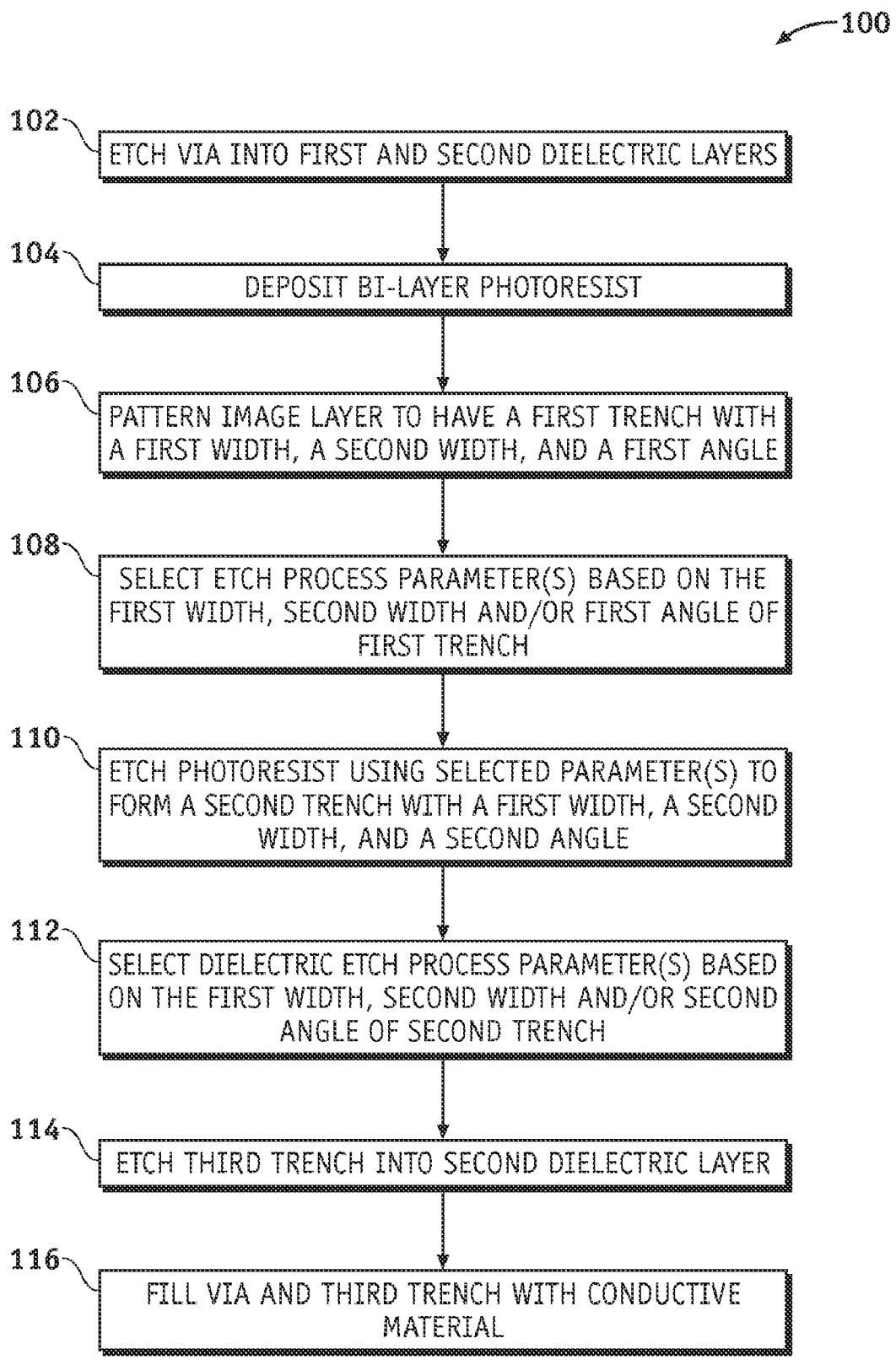
FIG. 6 is a flowchart of the method illustrated in FIGS. 1-5.

Referring to FIGS. 1 and 6, a via 220 is etched through third etch stop layer 212, second dielectric layer 210, second etch stop layer 208, and at least partially through first dielectric layer 206 (step 102). In a preferred embodiment of the invention, via 220 is etched through first dielectric layer 206 to first etch stop layer 204. Via 220 may have any suitable width but preferably is about 0.25 μm or less.

A bi-layer resist 218 is deposited overlying third etch stop layer 212 (step 104). The bi-layer resist 218 comprises a photoresist layer 214 and an overlying imaging layer 216. Bi-layer resist 218 may comprise any suitable, known photoresist materials and imaging layer materials. An example of a photoresist material available in the industry includes, but is not limited to, AR2450 available from Rohm & Hass of Philadelphia, Pa. An example of an imaging layer available in the industry includes, but is not limited to, SR2420, also available from Rohm & Hass. The photoresist layer 214 is deposited overlying third etch stop 212 and within via 220. Imaging layer 216 is formed overlying photoresist layer 214.

Figure 2:
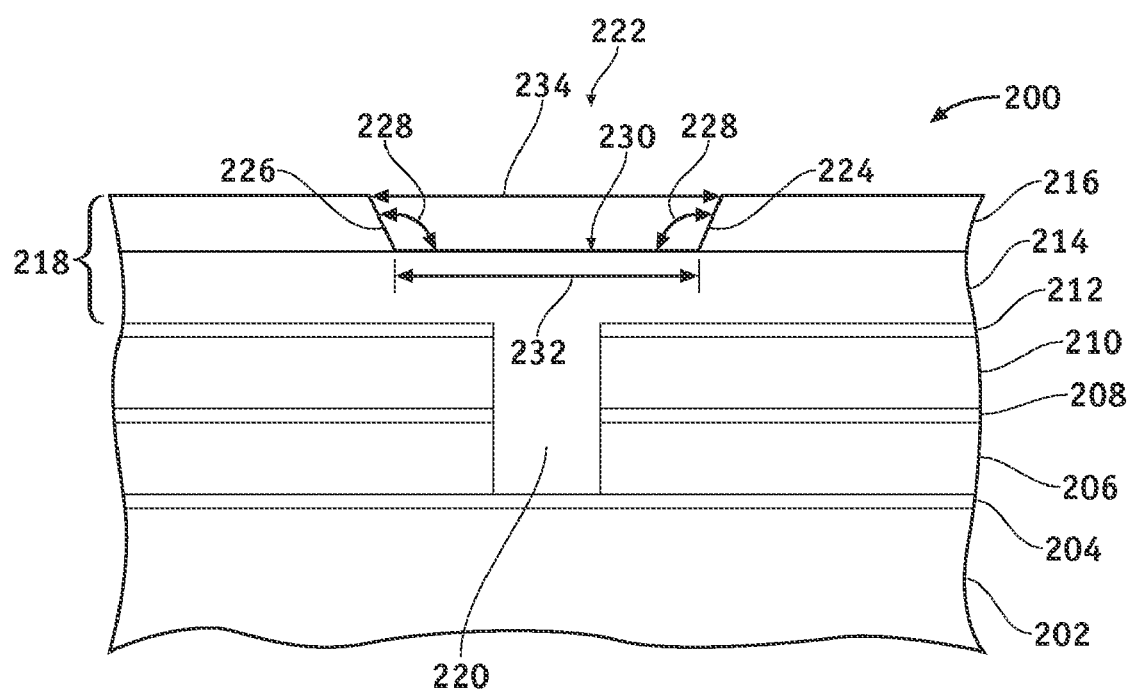

Referring to FIGS. 2 and 6, the image layer 216 of bi-layer resist 218 is patterned by exposing portions of it to light (through a mask, for example) and then to a developer, such as tetramethyl ammonium hydroxide (TMAH), for example (step 106). As illustrated in FIG. 2, imaging layer 216 is patterned to have an opening or trench 222 overlying via 220. In one embodiment of the invention, trench 222 has a circular or elliptical shape as viewed from the top of semiconductor structure 200. In another, preferred embodiment of the invention, trench 222 has a square or rectangular shape. Trench 222 is defined, at least in part, by a first wall 224 and a second wall 226 of imaging layer 216. Because the patterning process is not precisely anisotropic, each wall is disposed at an angle, greater than about 90°, indicated by double-headed arrow 228, from a surface 230 of photoresist layer 214. Accordingly, trench 222 has a first width, indicated by double-headed arrow 232, proximate to the photoresist layer 214 and a larger second width, indicated by double-headed arrow 234, remote from photoresist layer 214.

Figure 3:
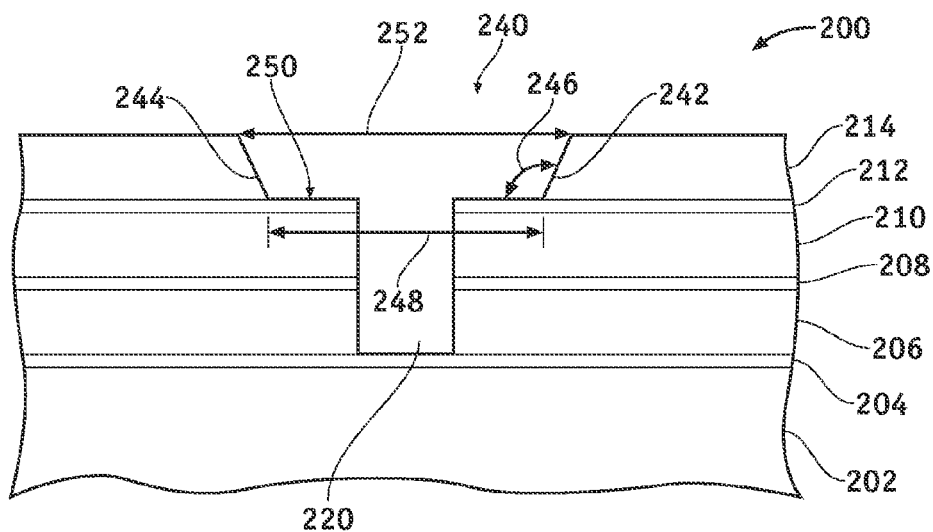
Figure 7:
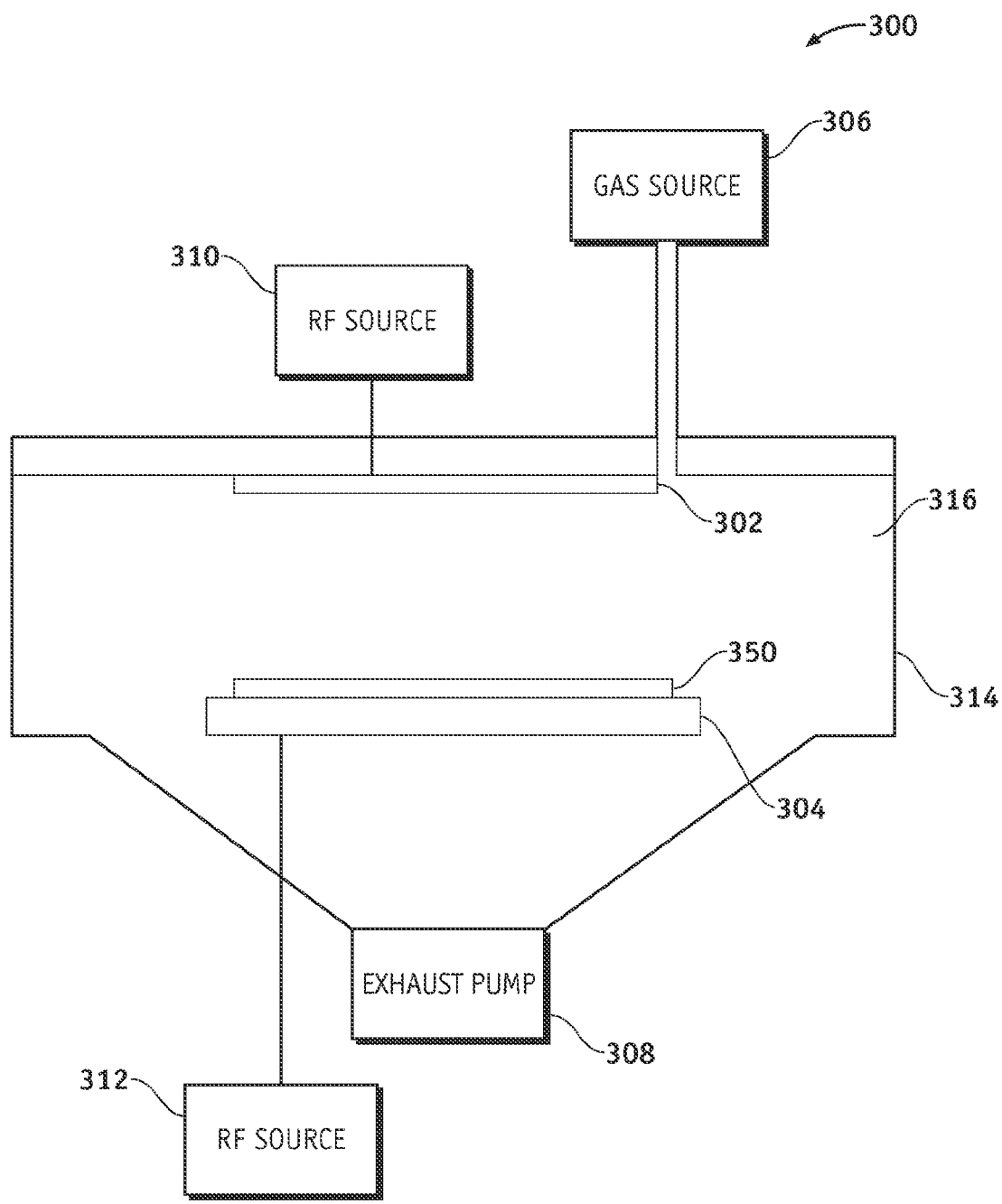
FIG. 7 is a cross-sectional schematic illustration of a plasma processing system that can be used to effect the method illustrated in FIGS. 1-5.

Referring to FIGS. 3 and 6, in an exemplary embodiment of the present invention, at least one process parameter for dry etching photoresist layer 214 is selected based on the first and second widths 232 and 234 of the trench 222 and the angle 228 of the image layer walls (step 108). Dry etching of the photoresist typically comprises subjecting the photoresist to a plasma generated in a plasma reactor of a plasma processing system. FIG. 7 is a schematic view of a plasma processing system 300. The plasma processing system 300 comprises a reactor chamber 316 having an upper electrode 302 and a lower electrode 304, an etching gas source 306, and an exhaust pump 308. Within reactor chamber 316, a wafer 350 comprising the semiconductor structure 200 of FIGS. 1-5 is positioned upon the lower electrode 304. Etching gas is supplied to the chamber 316 by gas source 306 and is exhausted from the chamber through an exhaust port by the exhaust pump 308. A first RF source 310 is electrically connected to the upper electrode 302. A second RF source 312 is electrically connected to the lower electrode 304. Chamber walls 314 surround the upper electrode 302 and the lower electrode 304. Accordingly, process parameters for dry etching the photoresist include the composition of the etching gas, the flow rate of each gas comprising the etching gas, the pressure within the reactor chamber, the power from the first RF source, the power from the second RF source, the distance between the first electrode and the second electrode, and the amount of time of the etching process.

As disclosed above, at least one of these process parameters may be selected or modified based on the first and second widths 232 and 234 of the trench 222 of the image layer 216 and the angle 228 of the image layer walls 224 and 226. These dimensions reflect the deviations from the desired pattern that should have been obtained from optimum developing of the image layer. By selecting or modifying one or more parameters of the dry etch process of the photoresist, the dry etch process can be "tuned" to compensate for such deviations resulting during the developing of the image layer. Selection or modification of a parameter of the etching process may be based on experimental data. That is, experimental data may indicate which parameter(s) should be modified or selected, and the extent to which the parameter(s) should be modified given a first width and a second width of the trench 222 of the image layer 216 and the angle 228 of the image layer walls. Alternatively, mathematical calculations may be used to determine which parameter(s) should be modified or selected, and the value to which the parameter(s) should be set given a first width and a second width of the trench 222 of the image layer 216 and the angle 228 of the image layer walls.

In an example recipe of a first step in a two-step dry etch process for etching photoresist 214, an etchant gas comprises oxygen and nitrogen. The oxygen has a flow rate of about 50-70 sccm, preferably about 60 sccm, and the nitrogen has a flow rate of about 150-250 sccm, preferably about 200 sccm. The pressure of the reactor chamber is in the range of about 8-12 mT, preferably about 10 mT. The upper RF source provides power at about 450-550 W, preferably about 500 W, and the lower RF source provides power at about 180-220 W, preferably about 200 W. The gap between the lower electrode and the upper electrode is about 55 mm and the duration of the etching process is about 40-50 seconds. In the second step, the etching gas comprises hydrogen and nitrogen. The hydrogen has a flow rate of about 400-600 sccm, preferably about 500 sccm, and the nitrogen has a flow rate of about 400-600 sccm, preferably about 500 sccm. The pressure of the reactor is in the range of about 50-150 mT, preferably about 100 mT. The upper RF source provides power at about 500-1500 W, preferably about 1000 W, and the lower RF source provides power at about 100-300 W, preferably about 200 W. The gap between the lower electrode and the upper electrode is about 55 mm and the duration of the etching process is about 20 to 30 seconds.

Accordingly, based on widths 232 and 234 of trench 222 of image layer 216 and angle 228 of the image layer walls, any of the above parameters may be modified, in either or both steps of the etching process, to compensate for the deviations in the developing of imaging layer 216 and to provide a more accurate etch of the photoresist layer 214. Improved accuracy of the photoresist layer etching process will facilitate accurate etching of a trench in the second dielectric layer 210 and thus provide more consistent product output. For example, in either or both of the steps of the etching process, it may be advantageous to change the flow rates of the etching gas or to change the composition of the etching gas by adding one or more additional gases, such as, for example, a fluorocarbon. Alternatively, or in addition, in either or both of the steps of the etching process, it may be advantageous to change the duration of the etching process, the reactor chamber pressure, and/or the power from one or both of the RF sources.

Referring now to FIGS. 3 and 6, once the process parameters for the photoresist dry etch process have been selected or modified, the photoresist 214 is etched (step 110) using the dry etch process. The photoresist layer 214 is etched to remove it from via 220 and to form a mask for subsequent etching of a trench within second dielectric layer 210, as discussed in more detail below. The etch chemistry used to etch photoresist layer 214 selectively etches the photoresist layer but does not substantially etch first stop layer 204 or third stop layer 212. The image layer 216 then may be removed from photoresist layer 214. Etching of photoresist layer 214 using patterned image layer 216 as a mask results in a trench 240 overlying via 220. Trench 240 is defined, at least in part, by a first wall 242 and a second wall 244 of photoresist layer 214. Each wall is disposed at an angle, indicated by double-headed arrow 246, from a surface 250 of third etch stop layer 212. Accordingly, trench 240 has a first width, indicated by double-headed arrow 248, proximate to the third etch stop layer 212 and a second width, indicated by double-headed arrow 252, remote from third etch stop layer 212. Second width 252 may or may not be equal to first width 248.

Figure 4:
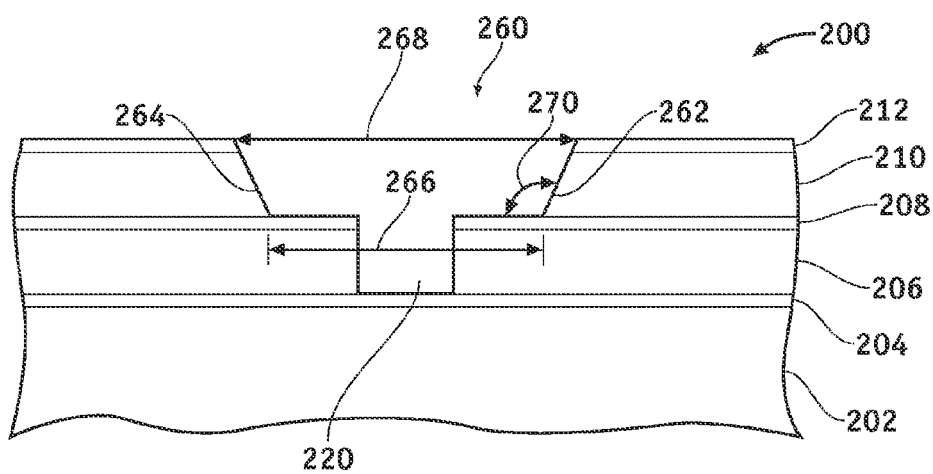

Referring to FIGS. 4 and 6, in another exemplary embodiment of the present invention, at least one process parameter for etching third etch stop layer 212 and second dielectric layer 210 is selected based on the first and second widths 248 and 252 of the trench 240 and the angle 246 of the photoresist layer walls 242 and 244 (step 112). These dimensions may reflect the deviations from the desired pattern that should have been obtained from an optimum patterning of the photoresist layer 214. By selecting or modifying one or more parameters of the dielectric etching process, the dielectric etching process also can be "tuned" to compensate for such deviations in the dry etch of the photoresist. Similar to the photoresist etch process, election or modification of a parameter of the dielectric etching process may be based on experimental data. That is, experimental data may indicate which parameter(s) should be modified or selected, and the value to which the parameter(s) should be set given a first width and a second width of the trench 240 of the photoresist layer 214 and the angle 246 of the photoresist layer walls. Alternatively, mathematical calculations may be used to determine which parameter(s) should be modified or selected, and the value to which the parameter(s) should be set given a first width and a second width of the trench 240 of the photoresist layer 214 and the angle 246 of the photoresist layer walls.

In an example recipe for a dielectric etch process for etching third etch stop layer 212 and second dielectric layer 210, an etchant gas comprises oxygen, argon, and trifluoromethane. The oxygen flow rate is about 10-20 sccm, preferably about 15 sccm, the argon flow rate is about 150-250 sccm, preferably 200 sccm, and the trifluoromethane flow rate is about 30-50 sccm, preferably about 40 sccm. The pressure of the reactor chamber is in the range of about 50-100 mT, preferably 70 mT. The upper RF source provides power at about 500-1500 W, preferably about 1000 W, and the lower RF source provides power at about 50-150 W, preferably 100 W. The gap between the lower electrode and the upper electrode is about 40 mm and the duration of the etching process is about 35 to about 50 seconds, ppreferably about 43 seconds.

Accordingly, based on widths 248 and 252 of trench 240 of photoresist layer 214 and angle 246 of the photoresist layer walls, any of the above parameters may be modified to compensate for the deviations in etching of photoresist layer 214 and to provide a more accurate etch of the second dielectric layer 210. For example, in the dielectric etching process, it may be advantageous to change the flow rates of the etching gas or to change the composition of the etching gas by adding one or more additional gases. Alternatively, or in addition, it may be advantageous to change the duration of the etching process, the reactor chamber pressure, and/or the power from one or both of the RF sources.

As illustrated in FIGS. 4 and 6, the third etch stop 212 and the second dielectric layer 210 then are etched (step 114). The etch chemistry used to etch second dielectric layer 210 selectively etches the third etch stop layer 212 and second dielectric layer 210 but does not substantially etch second stop layer 208 or first stop layer 204. Etching of second dielectric layer 210 using photoresist layer 214 as a mask results in a third trench 260 overlying via 220. Third trench 260 is defined, at least in part, by a first wall 262 and a second wall 264 of second dielectric layer 210. Third trench 260 has a first width, indicated by double-headed arrow 266, proximate to the second etch stop layer 208 and a second width, indicated by double-headed arrow 268, remote from second etch stop layer 208. In addition, walls 262 and 264 of second dielectric layer 210 will be disposed at an angle, indicated by double-headed arrow 270, from second etch stop layer 208. Thus, from the above description, it should be understood that "tuning" of the dry etch process, "tuning" of the dielectric etch process, or "tuning" both processes may be conducted to control the profile of trench 260. By selecting or modifying one or more parameters of the dry etch process and/or the dielectric etch process, improved accuracy of the trench etch process results, with widths 266 and 268 of second dielectric layer 210 and angle 270 being substantially closer to predetermined and/or desired magnitudes for these dimensions than if the parameter(s) of one or both of these processes was not so selected or modified. Such improved accuracy of the dielectric etching process in turn provides more consistent product output.

Figure 5:
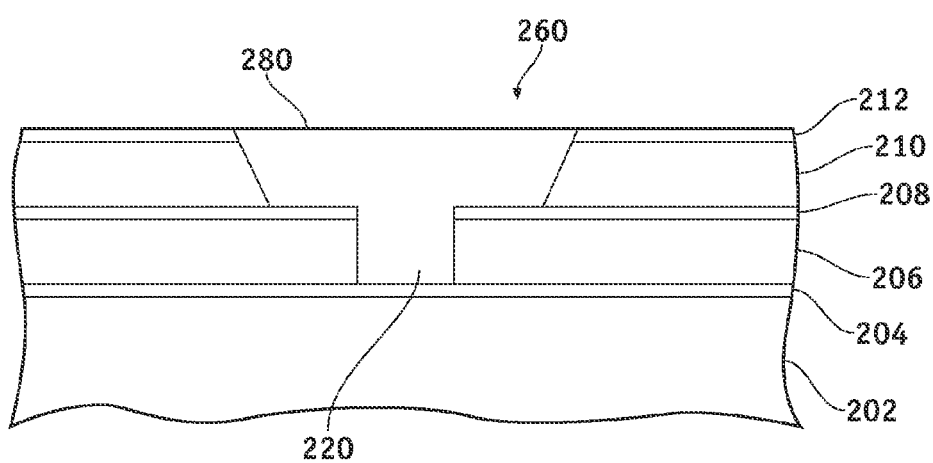

After etching of third trench 260, photoresist layer 214 may be stripped from third etch stop layer 212 by methods known in the art. Referring to FIG. 5 and 6, via 220 and third trench 260 are filled with a conductive material 280, such as copper, aluminum, gold, silver, alloys thereof, or the like (step 116). Any excess conductive material then may be removed by chemical mechanical planarization.

Figure 8:
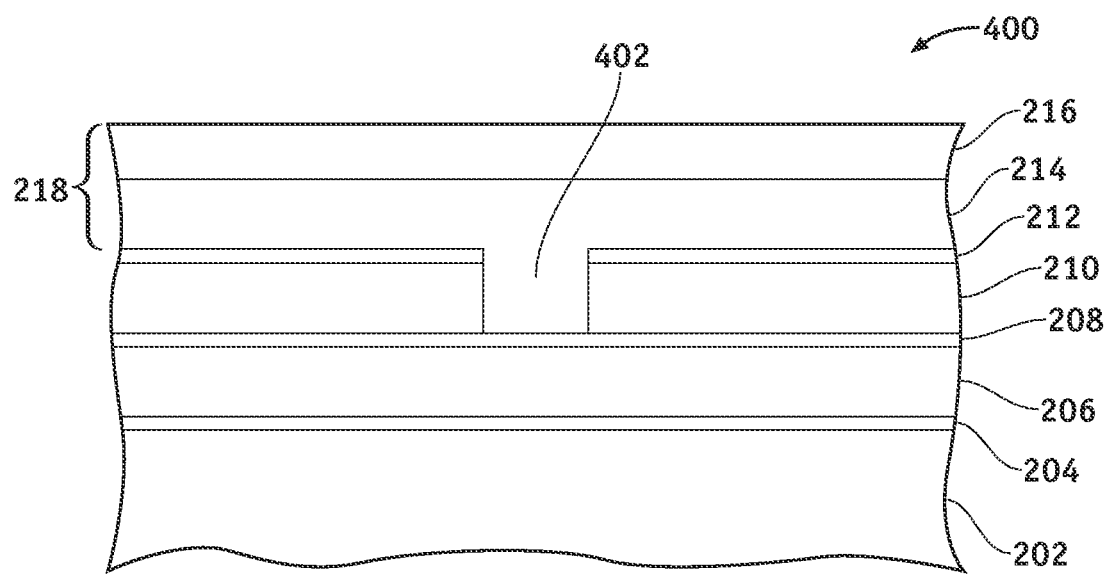
FIGS. 8-12 illustrate a method for controlling the profile of a trench etched into a semiconductor structure in accordance with another exemplary embodiment of the present invention.
Figure 11:
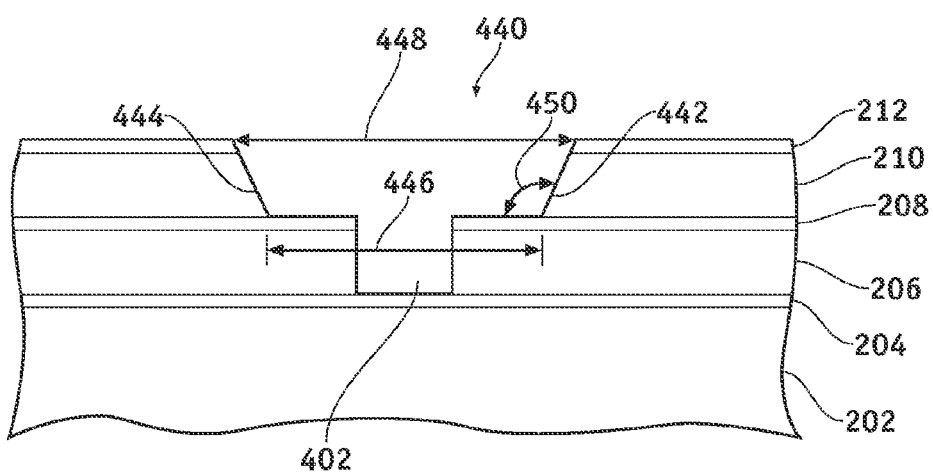
Figure 12:
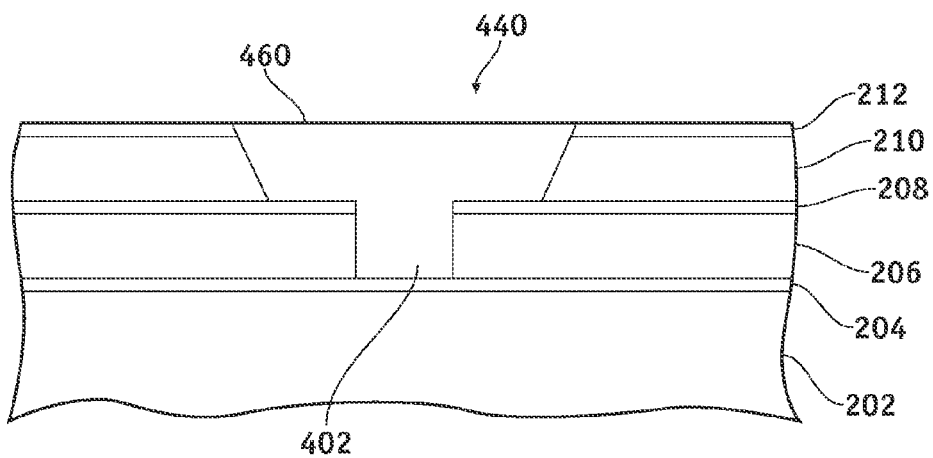
Figure 13:
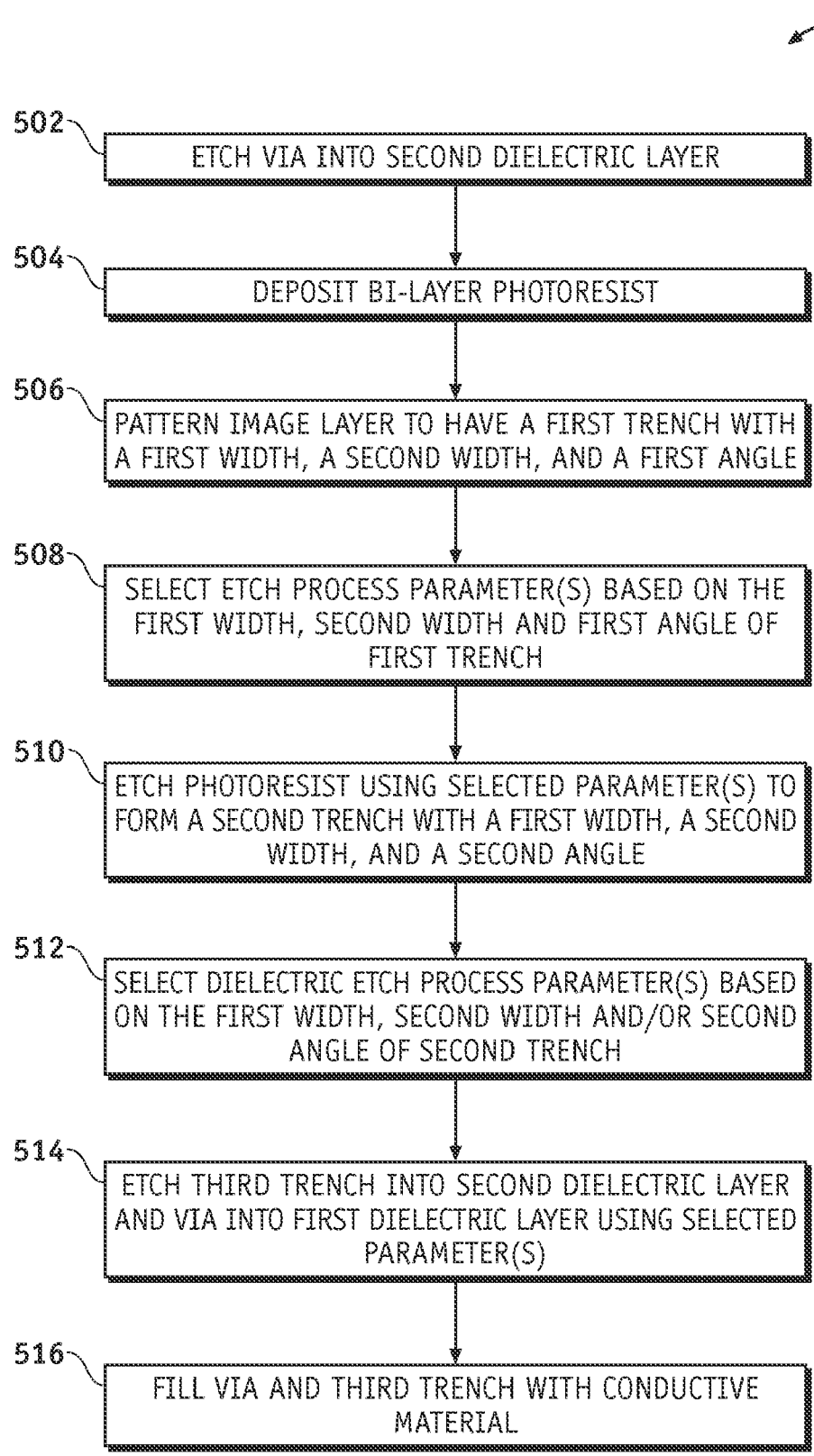
FIG. 13 is a flowchart of the method illustrated in FIGS. 8-12.

FIGS. 8-12 and 13 illustrate a method 500 for controlling the profile of a trench etched into a semiconductor structure 400 in accordance with another exemplary embodiment of the present invention. Referring to FIGS. 8 and 13, the method 500 begins with a semiconductor structure 400 having substrate 202, first etch stop layer 204 disposed overlying the substrate 202, first dielectric layer 206 disposed overlying the first etch stop layer 204, second etch stop 208 overlying the first dielectric layer 206, second dielectric layer 210 overlying the second etch stop layer 208, and optional third etch stop layer 212 overlying second dielectric layer 210. A via 402 is etched through third etch stop layer 212 and at least partially through second dielectric layer 210 (step 502). In a preferred embodiment of the invention, via 402 is etched through second dielectric layer 210 to second etch stop layer 208. Via 402 may have any suitable width but preferably is about 0.25 μm or less.

Bi-layer resist 218 is deposited overlying third etch stop layer 212 (step 504). As described above, the bi-layer resist 218 comprises photoresist layer 214 and overlying imaging layer 216. The photoresist layer 214 is deposited overlying third etch stop 212 and within via 402. Imaging layer 216 is formed overlying photoresist layer 214.

Figure 9:
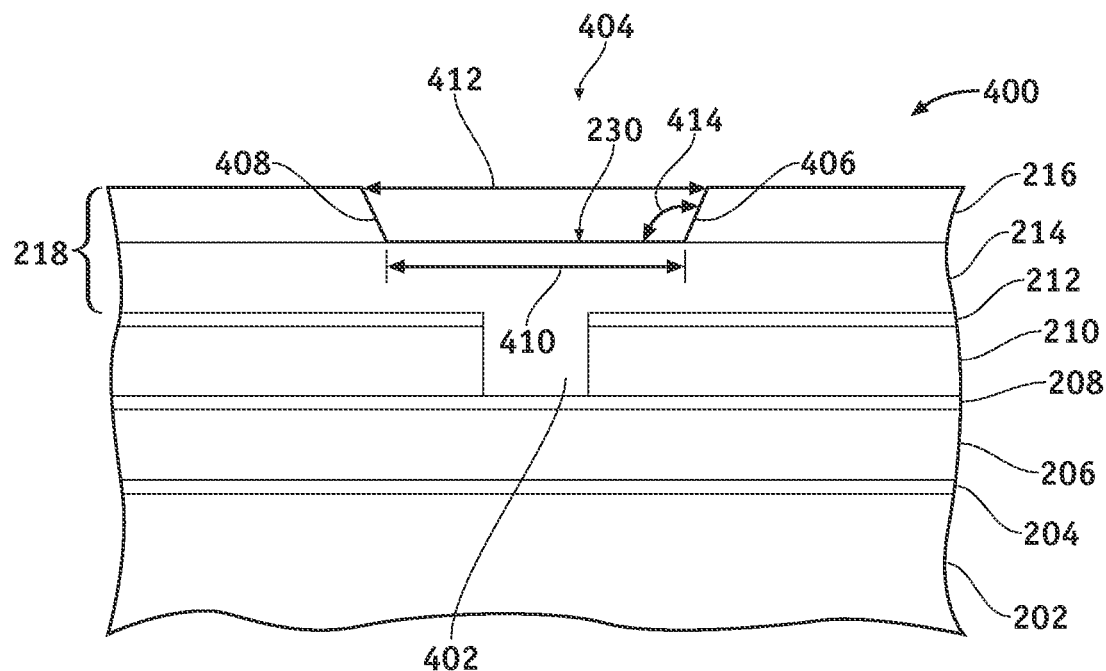

Referring to FIGS. 9 and 13, the image layer 216 of bi-layer resist 218 is patterned by exposing portions of it to light (through a mask, for example) and then to a developer, such as TMAH, for example (step 506). As illustrated in FIG. 9, imaging layer 216 is patterned to have an opening or trench 404 overlying via 402. In one embodiment of the invention, trench 404 has a circular or elliptical shape as viewed from the top of semiconductor structure 400. In another, preferred embodiment of the invention, opening 404 has a square or rectangular shape. Trench 404 is defined, at least in part, by a first wall 406 and a second wall 408 of imaging layer 216. Because the patterning process is not precisely anisotropic, each wall is disposed at an angle, greater than about 90°, indicated by double-headed arrow 414, from a surface 230 of photoresist layer 214. Accordingly, trench 404 has a first width, indicated by double-headed arrow 410, proximate to the photoresist layer 214, and a second width, indicated by double-headed arrow 412, remote from photoresist layer 214. Second width 412 is not equal to first width 410.

Figure 10:
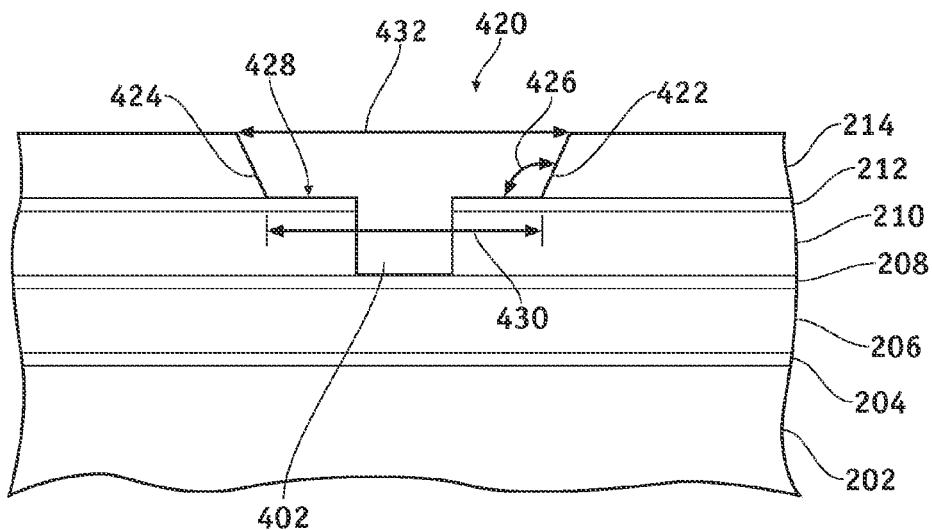

Referring to FIGS. 10 and 13, in an exemplary embodiment of the present invention, at least one process parameter for dry etching photoresist layer 214 is selected or modified based on the first and second widths 410 and 412 of the image layer and the angle 414 of the image layer walls (step 508). These dimensions, that is, widths 410 and 412 and angle 414, reflect the deviations from the desired pattern that should have been obtained from an optimum patterning of the image layer. As described above, selection or modification of one or more of the process parameters of the etching process may be based on experimental data. That is, experimental data may indicate which parameter(s) should be modified or selected, and the extent to which the parameter(s) should be modified given a first width and a second width of the trench 404 of the image layer 216 and the angle 414 of the image layer walls. Alternatively, mathematical calculations may be used to determine which parameter(s) should be modified or selected, and the value to which the parameter(s) should be set given a first width and a second width of the trench 404 of the image layer 216 and the angle 414 of the image layer walls.

Once the process parameters for the photoresist dry etch process have been selected or modified, the photoresist 214 is etched (step 510) using the dry etch process. The photoresist layer 214 is etched to remove it from via 402 and to form a mask for subsequent etching of a trench within second dielectric layer 210, as discussed in more detail below. The etch chemistry used to etch photoresist layer 214 selectively etches the photoresist layer but does not substantially etch second stop layer 208 or third stop layer 212. The image layer 216 then may be removed from photoresist layer 214. Etching of photoresist layer 214 using patterned image layer 216 as a mask results in a trench 420 within photoresist layer 214 and overlying via 402. Trench 420 is defined, at least in part, by a first wall 422 and a second wall 424 of photoresist layer 214. Each wall is disposed at an angle, indicated by double-headed arrow 426, from a surface 428 of third etch stop layer 212. Accordingly, trench 420 has a first width, indicated by double-headed arrow 430, proximate to the third etch stop layer 212, and a second width, indicated by double-headed arrow 432, remote from third etch stop layer 212. Second width 432 may or may not be equal to first width 430.

Referring to FIGS. 11 and 13, in another exemplary embodiment of the present invention, at least one process parameter for etching a trench through third etch stop layer 212 and second dielectric layer 210 is selected based on the first and second widths 430 and 432 of the photoresist layer 214 and the angle 426 of the photoresist layer walls 422 and 424 (step 512). These dimensions reflect the deviations from the desired pattern that should have been obtained from an optimum patterning of the photoresist layer 214. Similar to the photoresist etch process, selection or modification of a parameter of the dielectric etching process may be based on experimental data. That is, experimental data may indicate which parameter(s) should be modified or selected, and the value to which the parameter(s) should be set given a first width and a second width of the trench 420 of the photoresist layer 214 and the angle 426 of the photoresist layer walls. Alternatively, mathematical calculations may be used to determine which parameter(s) should be modified or selected, and the value to which the parameter(s) should be set given a first width and a second width of the trench 420 of the photoresist layer 214 and the angle 426 of the photoresist layer walls.

The third etch stop 212 and the second dielectric layer 210 then are etched using the modified dielectric etch process (step 514). In addition, second dielectric layer 210 serves as a mask during the etch process, thus resulting in the etch of via 402 through second etch stop layer 208 and first dielectric layer 204. The etch chemistry used to etch second dielectric layer 210 selectively etches the third etch stop layer 212, second dielectric layer 210, the second etch stop layer 208 and first dielectric layer 206 but does not substantially etch first etch stop layer 204. Etching of second dielectric layer 210 using photoresist layer 214 as a mask results in a third trench 440 overlying via 402. Third trench 440 is defined, at least in part, by a first wall 442 and a second wall 444 of second dielectric layer 210. Third trench 440 has a first width, indicated by double-headed arrow 446, proximate to the second etch stop layer 208 and a second width, indicated by double-headed arrow 448, remote from second etch stop layer 212. In addition, walls 442 and 444 of second dielectric layer 210 may be disposed at an angle, indicated by double-headed arrow 450, from second etch stop layer 208. Thus, from the above description, it should be understood that "tuning" of the dry etch process, "tuning" of the dielectric etch process, or "tuning" of both processes may be conducted to control the profile of trench 440. By selecting or modifying one or more parameters of the dry etch process and/or the dielectric etch process, improved accuracy of the trench etch process results, with widths 446 and 448 of second dielectric layer 210 and angle 450 being substantially closer to predetermined and/or desired magnitudes for these dimensions than if the parameter(s) of the dielectric etch process was not so selected or modified. Such improved accuracy of the dielectric etching process in turn provides more consistent product output.

After etching of third trench 440, photoresist layer 214 may be stripped from third etch stop layer 212 by methods known in the art. Referring to FIGS. 12 and 13, via 402 and third trench 440 are filled with a conductive material 460, such as copper, aluminum, gold, silver, alloys thereof, or the like (step 516). Any excess conductive material then may be removed by chemical mechanical planarization.

Accordingly, a method for controlling the profile of a trench etched into a semiconductor structure has been provided. The method utilizes one or more dimensions of an initial trench etched into an image layer of a bi-layer resist to modify or select process parameters for etching a photoresist layer of the bi-layer resist. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for controlling the profile of a trench of a semiconductor structure having a first dielectric layer, a first etch stop layer disposed on the first dielectric layer, a second dielectric layer disposed on the first etch stop layer, and a via formed at least through the second dielectric layer, the method comprising the steps of:

depositing a photoresist within the via that overlies the second dielectric layer;

depositing an image layer that overlies the photoresist and patterning the image layer to form a first trench within the image layer that overlies the via, wherein the first trench is defined at least partly by a first wall of the image layer disposed at a first angle, greater than about 90°, from a surface of the photoresist and a second wall of the image layer, wherein the first trench has a first width proximate to the photoresist and a second width remote from die photoresist, and wherein the first width and the second width of the first trench are not equal;

dry etching the photoresist using dry etch parameters, at least one of which is selected based on the first angle and the first and the second widths of the first trench to form a second trench in the photoresist and to remove the photoresist from the via; and etching the second dielectric layer to form a third trench in the second dielectric layer.

2. The method of claim 1, wherein the second trench is defined at least partly by a first wall of the photoresist disposed at a second angle with a surface of the second dielectric layer and a second wall of the photoresist, and wherein the second trench has a first width proximate to the second dielectric layer and a second width remote from the second dielectric layer, and wherein the step of etching the second dielectric layer comprises the step of etching the second dielectric layer with etching process parameters that are selected based on the first width and the second width of the second trench and the second angle.

3. The method of claim 1, further comprising the step of filling the third trench and via with a conductive material.

4. The method of claim 1, wherein the step of etching the second dielectric layer to form a third trench in the second dielectric layer further comprises etching a via into the first dielectric layer.

5. The method of claim 1, wherein the step of dry etching the photoresist using dry etch parameters, at least one of which is selected based on the first angle and the first and the second widths of the first trench, comprises the step of selecting the at least one dry etch parameter from a set of dry etch parameters that have been experimentally derived.

6. The method of claim 1, wherein the step of dry etching the photoresist using dry etch parameters, at least one of which is selected based on the first angle and the first and the second widths of the first trench, comprises the step of selecting the at least one dry etch parameter from a set of dry etch parameters that have been mathematically derived.

7. The method of claim 1, wherein the semiconductor structure further comprises a second etch stop layer disposed overlying the second dielectric layer and wherein the step of dry etching the photoresist comprises the step of dry etching the photoresist to form the second trench in the photoresist and to remove the photoresist from the via, wherein the second trench is defined by the first wall of the photoresist disposed at a second angle with a surface of the second etch stop layer and a second wall of the photoresist, and wherein the second trench has a first width proximate to the second etch stop layer and a second width remote from the second etch stop layer.

8. The method of claim 1, wherein the step of dry etching the photoresist using dry etch parameters, at least one of which is selected based on the first angle and the first and the second widths of the first trench, comprises the step of dry etching the photoresist using an etching gas flow rate that is selected based on the first angle and the first and the second widths of the first trench.

9. The method of claim 1, wherein the step of dry etching the photoresist using dry etch parameters, at least one of which is selected based on the first angle and the first and the second widths of the first trench, comprises the step of dry etching the photoresist using an etching gas composition that is selected based on the first angle and the first and the second widths of the first trench.

10. A method for forming a trench during dual damascene processing of a semiconductor structure, wherein the semiconductor structure has a first silicon oxide layer, a first etch stop layer disposed to overlie the first silicon oxide layer, a second silicon oxide layer that overlies the first etch stop layer, and a via formed within the first silicon oxide layer, the first etch stop layer, and the second silicon oxide layer, the method comprising the steps of:

depositing a photoresist within the via and that overlies the second silicon oxide layer;

forming a patterned mask that overlies the photoresist, wherein the mask has an opening disposed to overlie the via, and wherein the opening has a first width and a larger second width and wherein a wall of the mask defining the opening is at a first angle, greater than about 90°, from a surface of the photoresist;

etching the photoresist to substantially remove the photoresist from the via and to form a first trench in the photoresist that overlies the via, wherein etching of the photoresist is performed using at least one etch process parameter selected based on the first width and second width of the opening and the first angle, and wherein the first trench has a first width and a second width and wherein a wall of photoresist defining the first trench is at a second angle with a surface of the second silicon oxide layer; and etching the second silicon oxide layer to form a second trench therein, wherein the second trench has a first width and a second width, and wherein a wall of the second silicon oxide layer defining the second trench is at a third angle with the first etch stop layer, and wherein the first width and second width of the second trench and the third angle are formed based on the first width and the second width of the first trench and on the second angle.

11. The method of claim 10, wherein the step of etching the second silicon oxide layer comprises the step of etching the second silicon oxide layer using etch process parameters that are selected based on the first width and the second width of the first trench and on the second angle.

12. The method of claim 10, wherein the step of etching the photoresist to substantially remove the photoresist from the via and to form a first trench in the photoresist overlying the via, wherein etching of the photoresist is performed using at least one etch process parameter comprises the step of etching the photoresist using at least one etch process parameter that is selected from a set of dry etch parameters that have been experimentally derived.

13. The method of claim 10, wherein the step of etching the photoresist to substantially remove the photoresist from the via and to form a first trench in the photoresist overlying the via, wherein etching of the photoresist is performed using at least one etch process parameter, comprises the step of etching the photoresist using at least one etch process parameter that is selected from a set of dry etch parameters that have been mathematically derived.

14. The method of claim 10, wherein the step of etching the photoresist comprises the step of etching the photoresist using an RF source that provides power at a magnitude that is selected based on the first angle, and the first width and the second width of the opening.

15. The method of claim 10, wherein the step of etching the photoresist comprises the step of etching the photoresist using a reactor chamber pressure that is selected based on the first angle, and the first width and the second width of the opening.

16. A method for performing a dual damascene process on a semiconductor structure having a first etch stop layer, a first dielectric layer that overlies the first etch stop layer, a second etch stop layer that overlies the first dielectric layer, and a second dielectric layer that overlies the second etch stop layer, the method comprising the steps of:

etching a via through at least the second dielectric layer;

depositing a photoresist within the via that overlies the second dielectric layer;

depositing an image layer that overlies the photoresist layer;

patterning the image layer to form a first trench in the image layer, wherein the first trench has a first width and a second width that is not equal to the first width, and wherein a surface of the photoresist and a wall of the image layer defining the first trench form a first angle that is greater than about 90°;

selecting at least one process parameter of a process to etch the photoresist, wherein the at least one process parameter is selected based on the first angle and the first and second widths of the first trench;

etching the photoresist using the at least one process parameter to form a second trench in the photoresist;

etching a third trench in the second dielectric layer; and depositing a conductive material within the via and the third trench.

17. The method of claim 16, wherein the step of etching a via through at least the second dielectric layer comprises the step of etching a via through the second dielectric layer, the second etch stop layer, and at least a portion of the first dielectric layer.

18. The method of claim 16, wherein the second trench has a first width and a second width that is not equal to the first width of the second trench, and wherein a surface of the second dielectric layer and a wall of the photoresist form a second angle, and wherein the step of etching a third trench in the second dielectric layer comprises the step of selecting at least one process parameter of a process to etch the second dielectric layer, wherein the at least one process parameter is selected based on the second angle and the first and second widths of the second trench.

19. The method of claim 16, wherein the step of selecting at least one process parameter comprises the step of selecting the at least one process parameter from a plurality of process parameters that have been experimentally derived.

20. The method of claim 16, wherein the step of etching the photoresist comprises the step of etching the photoresist to form a second trench having a first width and a larger second width.

* * * * *